United States Patent [19]

Argentini

[11] Patent Number: 4,798,643
[45] Date of Patent: Jan. 17, 1989

[54] SELF-ALIGNING BONDING TECHNIQUE

[75] Inventor: Dino E. Argentini, Danvers, Mass.
[73] Assignee: Raytheon Company, Lexington, Mass.
[21] Appl. No.: 721,243
[22] Filed: Apr. 8, 1985
[51] Int. Cl.[4] .............................................. B32B 31/12
[52] U.S. Cl. .................................. 156/295; 51/283 R; 156/154; 428/149
[58] Field of Search ............... 51/216 LP, 216 R, 229, 51/283 R; 156/154, 295; 428/149

[56] References Cited

U.S. PATENT DOCUMENTS

| | | | |
|---|---|---|---|
| 2,253,298 | 8/1941 | Hyde | 428/149 |
| 2,434,614 | 1/1948 | Hicks | 156/154 X |
| 3,194,702 | 7/1965 | Geller et al. | 156/154 X |
| 3,963,551 | 6/1976 | Marlinski | 156/295 |
| 4,082,213 | 4/1978 | Rangabe | 51/216 R X |
| 4,106,915 | 8/1978 | Kagawa et al. | 51/283 R X |
| 4,384,431 | 5/1983 | Jackson | 51/216 R X |
| 4,388,132 | 6/1983 | Hoge et al. | 156/295 X |

*Primary Examiner*—Robert A. Dawson
*Attorney, Agent, or Firm*—Denis G. Maloney; Richard M. Sharkansky

[57] ABSTRACT

A method of providing uniform application of pressure during thermocompression bonding of semiconductor elements onto a bonding surface of a semiconductor package is described. A member having a plane surface is interposed between the semiconductor element and the bonding tool to provide a uniform force distribution to the plane surface of the member and hence to the semiconductor elements. In a preferred embodiment, a plano-convex vitreous member is placed upon the top of the semiconductor element with the plane surface thereof contacting the semiconductor element. A bonding tool is brought into contact with the convex surface portion of the hemisphere transmitting a uniform force to the plane surface, Thus, uniform force is brought to bear upon the semiconductor element providing a uniform thermocompression bond between the semiconductor element and the bonding surface. The plano-convex members are provided by placing members having at least one curved surface, for example, spheres in an abradible securing medium and abrading an exposed area of said spheres and the medium until a predetermined plane surface is provided. The resulting plano-convex members are then freed from the medium and recovered.

7 Claims, 2 Drawing Sheets

SELF-ALIGNING BONDING TECHNIQUE

The Government has rights in this invention pursuant to Contract No. F33615-81-C-1470 awarded by the Department of the Air Force.

BACKGROUND OF THE INVENTION

This invention relates generally to semiconductors and more particularly to packaging of semiconductors.

As is known in the art, semiconductors, such as a mesa-shaped IMPATT diode, are often used in applications where high output power at microwave frequencies is required. When used in such applications, the IMPATT diode, for example, is generally bonded to a heat spreader member to dissipate or extract from the diode the heat generated by the diode. Due to the temperature at which the diode operates, it is important to provide a uniform bond between a bottom contact portion of the diode and the heat spreader. Such a uniform bond is required to minimize the thermal resistance of the mounted diode thereby permitting the diode to operate at high output power levels without damaging the diode. However, since such diodes are very small and fragile providing uniform bonds is very difficult.

A technique for bonding the IMPATT diode generally involves placing the bottom contact of the diode on the heat spreader and bringing a bonding tool into contact with an upper electrode contact of the diode while the heat spreader is raised to an elevated temperature. Pressure is applied to the mesa by the bonding tool and in combination with the elevated temperature of the heat spreader a thermocompression bond is provided between the bottom contact and the heat spreader. If the bonding tool is placed directly over the mesa portion of the diode and unguided during bonding, there is a tendency for the tool to tilt the diode since there is a slight tendency for the bonding operator to apply the bonding tool at an angle off of perpendicular with respect to the heat spreader and lower contact of the diode. Thus, the resulting bond provided between the diode and the heat spreader will not be uniform. The nonuniform bond will result in a reduction in the area of the diode bonded to the heat spreader and will cause a concomitant increase in the thermal resistance of the diode. Thus, in order to provide a uniform bond between the mesa and the heat spreader, the bonding tool must be brought to bear upon the upper contact substantially perpendicularly to the lower contact/heat spreader interface.

One technique used during the bonding operation is to guide the bonding tool perpendicularly to the diode contact/heat spreader interface while supporting the diode package during bonding with a "tip and tilt" device which permits adjustment of the position of the diode package. This device includes a pair of concentric overlaying steel plates joined at their center by a flexible steel pin. The plates are separated by a predetermined distance. Two screws located 90 degrees apart are tapped into the periphery of the upper plates and loaded against the lower plate by two corresponding opposing springs. The springs are in compression between the plates. This device permits universal angular orientation of one plate against the other. The bonding tool is disposed at an end of a pivotally mounted arm. The plates are adjusted such that the bonding tool will contact the diode at an angle normal to the diode contact/heat spreader interface. While this technique provides some improvement in the uniformity of bonds between the mesa and the heat spreader, imperfections in the dimensions of the package generally require that each individual package be re-aligned by a reiterative adjustment of the tip and tilt device prior to performing the bonding operation. This is a very long and tedious process.

SUMMARY OF THE INVENTION

In accordance with the present invention, uniform application of pressure during bonding of semiconductor elements onto a bonding surface of a semiconductor package is provided. A member having a plane surface is placed over an upper portion of the semiconductor element with the plane surface thereof disposed adjacent to the upper portion of the semiconductor element. A bonding tool is brought into contact with an opposing surface portion of the member. The shape of the upper surface of the member, as well as, the shape of the contacting surface of the bonding tool are selected to provide a point contact between the bonding tool and upper surface, thus transmitting an applied uniform force to the plane surface of the member. With this arrangement, uniform pressure is brought to bear upon the semiconductor element providing a uniform bond between the semiconductor element and the bonding surface.

In accordance with a further aspect of the present invention, a method for providing a uniform thermocompression bond between a bottom contact portion of a diode and a heat spreader surface includes the steps of providing a plano-convex member over an upper contact portion of the diode and bringing a bonding tool to bear upon the convex portion of the member, while the heat spreader is at a predetermined elevated temperature. With such an arrangement, in response to the pressure exerted by the bonding tool upon the convex portion of the member, a uniformly distributed pressure is provided at the plane surface of the plano-convex member. This uniformly distributed pressure in turn is distributed to the bottom contact of the diode providing a uniform bond between the diode contact and the heat spreader without the process difficulties associated with prior techniques.

In accordance with a further aspect of the present invention, uniform thermocompression bonds are provided amongst the upper electrode of the diode, a spacer member through which the diode is disposed having an upper contact portion bonded to the spacer, a heat spreader surface of a diode package, and a lid portion of the diode package. A plano-convex member having a selected diameter or plano-face surface area is disposed over the lid. A bonding tool is brought to bear upon the convex surface of the member while the package is at a predetermined elevated temperature transmitting a uniform pressure to the plane surface of the member. With such an arrangement, uniform bonds are provided amongst the upper electrode of a diode, the spacer, and the lid.

In accordance with a further aspect of the present invention, a method for making plano-convex members includes the steps of securing members having at least one curved surface in an abradible medium and abrading a surface portion of said medium and the secured members to provide each of said secured members with a plane surface. With this arrangement, the members are released from the abradible medium and recovered. Such members may then be used during bonding of semiconductor devices to provide uniform bonds between the diode and the heat spreader bonding surface.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENT

Figure 1:
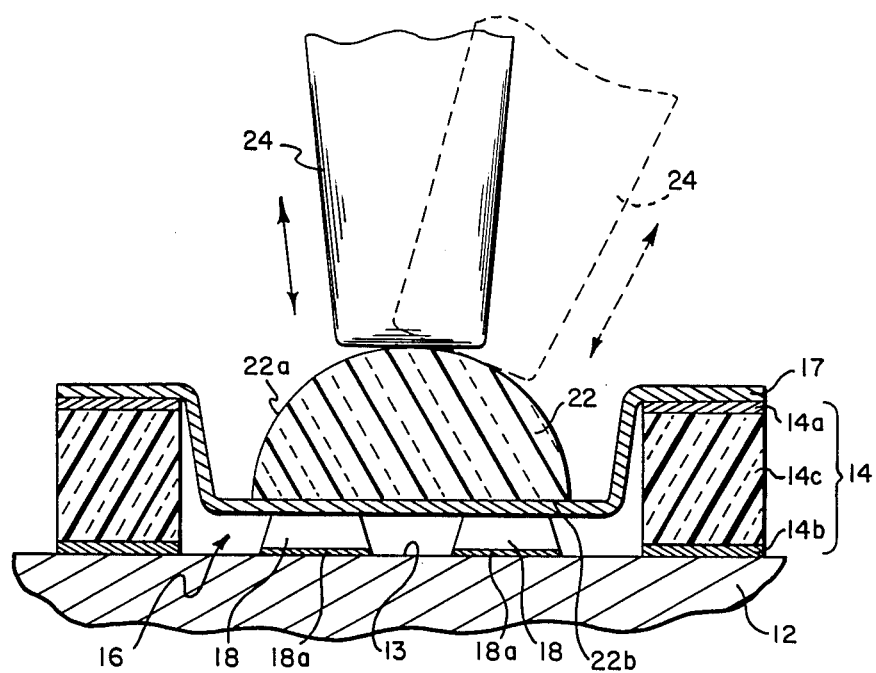
FIG. 1 is a cross-sectional diagrammatical view of an IMPATT diode being bonded to a heat spreader surface in accordance with the present invention.
Figure 2:
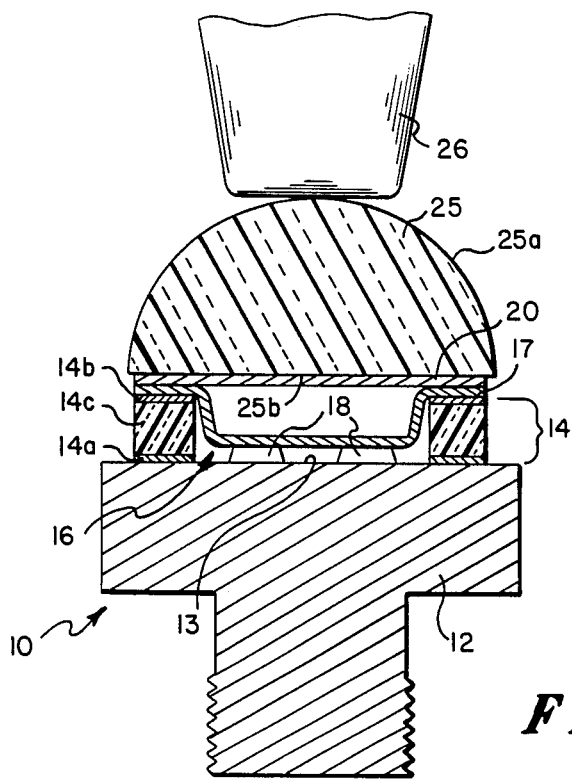
FIG. 2 is a cross-sectional view of the diode mounted on the heat spreader surface of a diode package in accordance with FIG. 1 which has a lid portion also mounted in accordance with the present invention.

Referring now to FIG. 1, a semiconductor device 16, here a quadramesa IMPATT diode having four mesa portions 18 (only two shown) interconnected together by a common upper electrode patterned conductor 17 is shown. Each mesa portion 18 includes a lower contact 18a which is disposed on a heat spreader surface 13 portion of a semiconductor diode package 12 (FIG. 2). The diode 16 is disposed within an aperture (not numbered) provided in an annular spacer member 14. The annular spacer 14 includes upper and lower conductive surfaces 14a, 14b, respectively, spaced by an intermediate dielectric portion 14c. An interposed member, here a plano-convex member 22, more particularly a hemisphere comprised of a vitreous material is disposed over the upper electrode patterned conductor 17 of the semiconductor device 16. Techniques for fabricating such a plano-convex member 22 will be described in conjunction with FIGS. 3–4. The heat spreader surface 13 typically having a plated gold surface is raised to a predetermined elevated temperature, typically in the range of 250° C. to 350° C. After the surface 13 is at the predetermined temperature, a bonding tool member 24 (here shown in two of many possible positions) is brought to bear and apply pressure to the convex surface 22a of plano-convex member 22. The convex surface of the plano-convex member 22 transmits a uniformly distributed pressure substantially independent of the position of the bonding tool on the convex surface, to the plane surface 22b of the plano-convex member 22. In turn, the plane surface 22b of the plano-convex member 22 transmits a uniformly distributed pressure to the upper patterned conductor 17 providing a uniform thermocompression bond between each of the contacts 18a and the heat spreader surface 13. After bonding, the plano-convex member 22 is removed.

The bonding tool 24 which is brought to bear upon the convex surface 22a of the plano-convex member 22 permits the force applied from the bonding tool to the convex surface 22a to be transmitted substantially uniformly at the plane surface 22b of the plano-convex member 22. More particularly, the plano-convex member provides point contact distribution of an applied force to the convex portion of the member. The plano-convex member 22 is here comprised of a vitreous material. The material chosen for the member must be capable of acquiring a plane surface and of maintaining that surface when subjected to elevated temperatures. Further, the member should not adhere to the upper electrode contact which generally is comprised of a metal such as gold. The interposed member of which the plano-convex member is one example need not be a hemisphere or a sphere portion. For example, the convex portion of the member could alternatively be an aspherical curved surface. Further, the interposed member need not have a curved surface. For example, an interposed member having an apex portion and a plane portion such as a conically shaped member, a pyramid or a triangular solid could also be used. Further, the apex or curved surface need not be a part of the interposed member. The interposed member may be a plate and the bonding tool may have the apex portion. Accordingly, the requirement for the shape of the interposed member is that it must have at least one plane surface and the opposing surface of the interposed member and the bonding tool surface must provide in combination point contact.

Several advantages result from this arrangement. The use of the plano-convex member 22 transmits in response to the pressure applied by the bonding tool a more uniform bonding pressure to each contact portion 18a of each mesa 18 providing a uniform bond between the mesa contact 18a and the heat spreading surface 13. The tip and tilt platform technique and its required adjustment for each bonding operation is eliminated thereby speeding up the bonding process and reducing the level of operator skill required during the bonding process. Furthermore, to change the diameter of the area to be bonded, it is only required to select a plano-convex member having an appropriate diameter; that is, an appropriate plano-surface area.

Referring now to FIG. 2, the mounted package IMPATT diode 10 is shown. The package diode 10 is shown to include a threaded pedestal stud member 12 having the bonding or heat spreading surface 13. The mounted semiconductor device 16 is shown bonded to said bonding surface 13 as described in conjunction with FIG. 1. Disposed over the upper electrode contact 17 and the upper surface 14a of annular member 14 is a lid portion 20 which will be thermocompression bonded to the annular member 14 using a second plano-convex member 25, here also a hemisphere having a second plano-surface area substantially equal to the surface area of the lid 20. Again, a bonding tool 26 is brought to bear upon convex portion 25a of member 25, while package 10 is raised to an elevated temperature. In response, the plane surface 25b provides uniformly distributed pressure to the lid 20. Thus, uniform bonds are provided amongst the bonding surface 13, the conductive surface 14a of annular member 14, lid 20 and upper electrode pattern 17. These uniform bonds further reduce the thermal resistance of the packaged diode.

Figure 3:
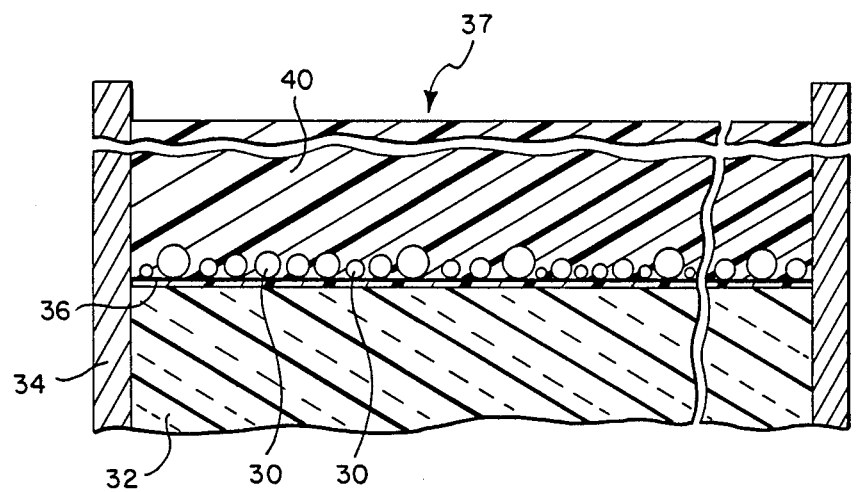
FIGS. 3–4 are cross-sectional views showing the steps in fabricating plano-convex members used in bonding of semiconductors of FIGS. 1 and 2 in accordance with a further aspect of the present invention.
Figure 4:
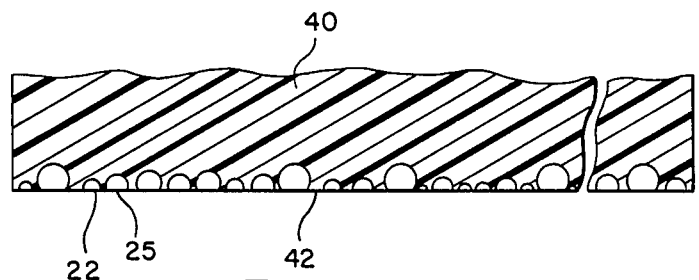

Referring now to FIGS. 3 and 4, fabrication of the plano-convex members 22, 25 (FIGS. 1 and 2) will now be described. A substrate 32, here comprised of a glass is provided with a layer 36 of a mold release coating such as a silicone-based grease. A form 34 is provided around the periphery of the glass plate substrate member 32, here such form 34 may comprise a material such as a paper tape having at least one tacky surface. The form 34 provided around a periphery of the glass plate member 32 provides a well or reservoir region 37 over the glass plate 32. A plurality of here spherical vitreous members 30 are then sprinkled into the reservoir region 37 over the coated surface of plate member 32. Suitable members may be obtained from Potter Industries, Hasbrouck Heights, N.J. 07604, solid glass spheres, Cat No. P-010. Such members are commonly used in special fluid filters. The vitreous spheres 30 may have diameters ranging typically from 100 to 500 microns or any other suitable diameter. An epoxy 40 or other suitable abradible, securing medium is then poured into the well or reservoir region 37 and is allowed to harden. After the epoxy 40 hardens, the form 34 is removed leaving the glass plate 32 with an epoxy layer 40 thereon. The glass plate 32 is also separated from the epoxy layer 40 at the glass/grease interface. The exposed epoxy/spherical surface 42 is abraded against a series of successively finer grades of abrasion paper until a suitable flatness and polish for the plane surface of the plano-convex members 22, 25 is provided (FIG. 4). After a suitable flatness and polish has been provided to the plano-convex members 22, 25, the epoxy layer 40 is immersed in a dissolvent which is used to dissolve away the epoxy, freeing the individual ones of plano-convex members 22, 25. It is to be noted that hemispheres and other spherical portions may be provided from this method by selecting the diameter of the spherical member and controlling the amount of abrasion of such member to provide the plane surface.

Having described preferred embodiments of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

What is claimed is:

1. A method for providing a uniform bond between a pair of members with a first member disposed over the second member includes the steps of:
    providing a plano-convex member having a plane surface over an upper portion of the second member with the plane surface of the member disposed adjacent the upper portion of the second member; and
    applying a force to a portion of the member opposite to the plane portion of the member to provide a substantially uniformly distributed pressure to the plane portion of the member.

2. The method as recited in claim 1 wherein the first member is a lid portion of a semiconductor package and the second member is an annular spacer member of the semiconductor package.

3. The method as recited in claim 1 wherein the first member is a diode and the second member is a heat spreader surface of a diode package.

4. A method for providing a uniform bond between a bottom contact portion of a diode and a heat spreader surface upon which said bottom contact is disposed includes the steps of:
    providing a plano-convex member over an upper portion of the diode with the plano surface of the member disposed on the upper portion of the diode; and
    applying a force to the convex portion of the plano-convex member, to provide a substantially uniformly distributed pressure at the plano portion of the member.

5. The method as recited in claim 4 wherein the force is applied to the member while the heat spreader surface is raised to a predetermined elevated temperature.

6. A method of forming a plano-convex member having a diameter of less than about 500 microns comprises the steps of:
    securing a plurality of solid members having at least one curved surface in an abradible medium;
    abrading said medium and a surface of said members to provide said members having the plane surface; and
    releasing said members having the plane surface from the abradible medium.

7. The method as recited in claim 6 wherein the solid members are spheres.

* * * * *